United States Patent
Pritchard

(10) Patent No.: US 7,302,667 B1
(45) Date of Patent: Nov. 27, 2007

(54) METHODS AND APPARATUS FOR GENERATING PROGRAMMABLE DEVICE LAYOUT INFORMATION

(75) Inventor: Jeffrey Orion Pritchard, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 556 days.

(21) Appl. No.: 10/826,756

(22) Filed: Apr. 15, 2004

(51) Int. Cl.
*G06F 17/50* (2006.01)
(52) U.S. Cl. ............................ 716/15; 716/12; 716/13
(58) Field of Classification Search .................. 716/1, 716/8–15
See application file for complete search history.

(56) References Cited

U.S. PATENT DOCUMENTS 7,117,459 B2* 10/2006 Tanimoto et al. .............. 716/4
7,120,885 B2* 10/2006 Nakayama et al. ............. 716/9
7,149,827 B1* 12/2006 Pritchard et al. ........... 710/100
7,162,591 B1* 1/2007 Miranda et al. ............ 711/149
2002/0083400 A1* 6/2002 Chung et al. .................. 716/3

OTHER PUBLICATIONS

Braddock Gaskill, "Open Source PCB Design Tools", Sep. 24, 1999, 5 pages.

* cited by examiner

*Primary Examiner*—Vuthe Siek
(74) *Attorney, Agent, or Firm*—Beyer Weaver LLP

(57) ABSTRACT

Methods and apparatus are provided for implementing a programmable device on a printed circuit board. Input data to implement a processor core and components on a programmable chip is received. The processor core and components can be customized based on particular user needs. The input data is used to generate the programmable chip along with information allowing efficient and effective interconnectivity of the programmable chip with external devices.

26 Claims, 7 Drawing Sheets

METHODS AND APPARATUS FOR GENERATING PROGRAMMABLE DEVICE LAYOUT INFORMATION

BACKGROUND OF THE INVENTION

1. Field of the Invention

The present invention relates to programmable devices. In one example, the present invention relates to techniques and mechanisms for generating interconnections between a programmable device and external components.

2. Description of Related Art

A number of benefits have spurred efforts towards developing programmable chips having both logic elements and a processor core. In one example, integrating processor cores with logic elements on a single programmable chip allows efficient and effective processing using a variety of different logic mechanisms and functions. In one example, programmable chips are provided with not only logic elements and memory, but with processor cores and other components as well. Integrating processor cores and other components onto a programmable chip allow designers to more efficiently implement descriptions on programmable devices by allowing some functions to be performed by a processor core and other functions to be performed using logic elements and hardware acceleration.

Some mechanisms for implementing a processor core entail using a general purpose programming language or high level language. In one example, code written in a general purpose programming language such as C or C++ is converted into a hardware descriptor language (HDL) file using a tool such as the DK1 Design Suite available from Celoxica Corporation of Abingdon, England. The HDL file can then be synthesized and implemented on a programmable chip such as a programmable logic device (PLD) or a field programmable gate array (FPGA). Some available synthesis tools are Leonardo Spectrum, available from Mentor Graphics Corporation of Wilsonville, Oregon and Synplify available from Synplicity Corporation of Sunnyvale, Calif.

However, mechanisms for interconnecting programmable devices having processor cores and components with external devices are limited. It is therefore desirable to provide improved methods and apparatus for optimizing implementation of interconnections between a programmable chip and external devices.

SUMMARY OF THE INVENTION

Methods and apparatus are provided for implementing a programmable device on a printed circuit board. Input data to implement a processor core and components on a programmable chip is received. The processor core and components can be customized based on particular user needs. The input data is used to generate the programmable chip along with information allowing efficient and effective interconnectivity of the programmable chip with external devices.

In one embodiment, a method for implementing a programmable chip system is provided. Customization information associated with a processor core and a plurality of programmable chip components is received. The processor core and the plurality of programmable chip components are configured for implementation on the programmable chip. Voltage and ground pins associated with the programmable chip are determined. A netlist is provided, wherein a printed circuit board layout tool uses the netlist to generate a layout coupling the processor core and the plurality of programmable chip components to off-chip components.

In another embodiment, a system for implementing a programmable device is provided. The system includes an interface and a processor. The interface is operable to receive customization information associated with a processor core and a plurality of programmable chip components. The processor configures the processor core and the plurality of programmable chip components for implementation on the programmable chip. The processor determines voltage and ground pins associated with the programmable chip and provide a netlist to a printed circuit board layout tool. The printed circuit board layout tool uses the netlist to generate a connection layout coupling the processor core and the plurality of programmable chip components to off-chip components.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Figure 1:
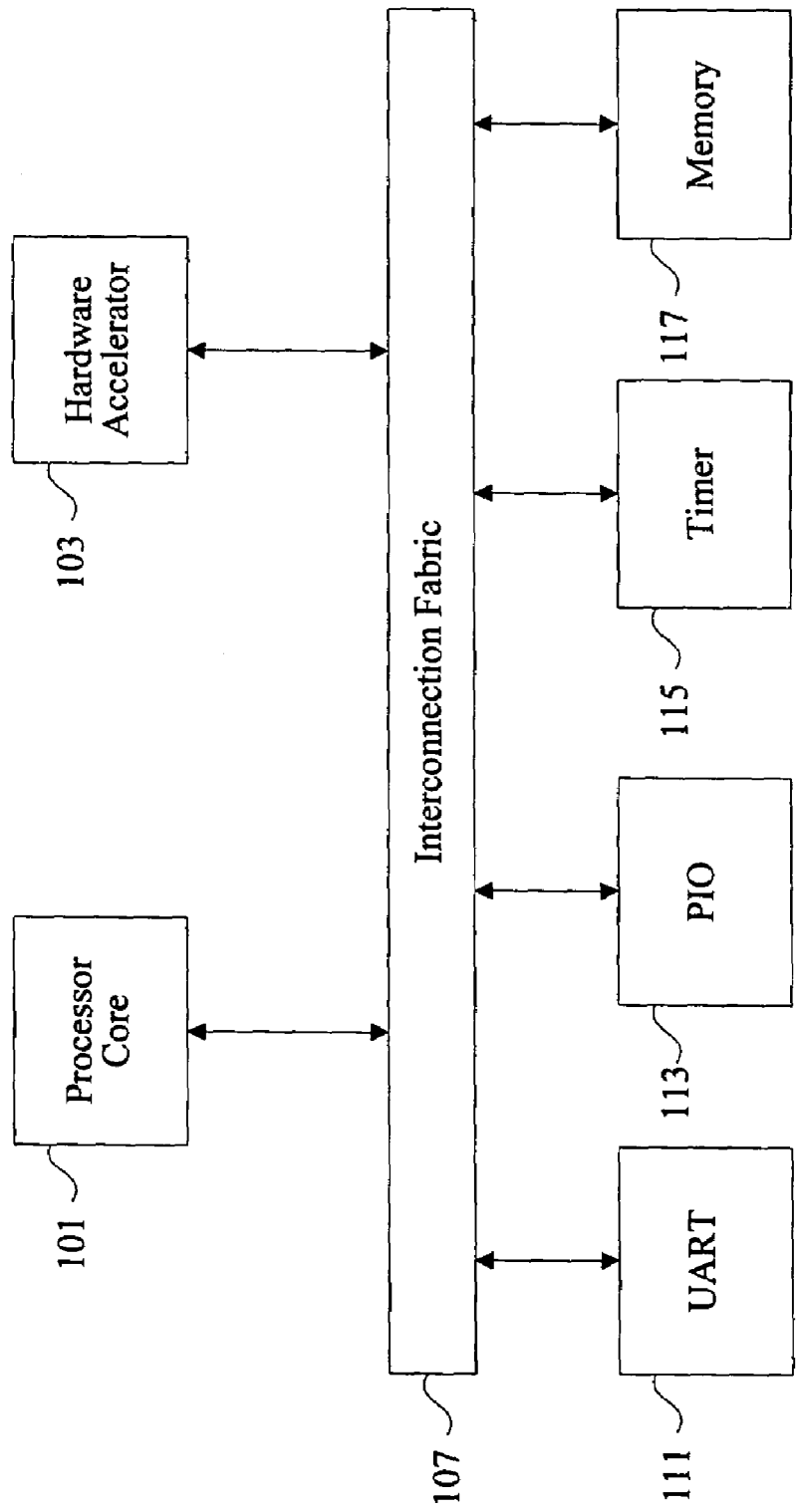
FIG. 1 is a diagrammatic representation showing a programmable device.

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. For example, the techniques of the present invention will be described in the context of particular processors and memory.

However, it should be noted that the techniques of the present invention can be applied to a variety of types of devices. In the following description, numerous specific details are set forth in order to provide a thorough understanding of the present invention. The present invention may be practiced without some or all of these specific details. In other instances, well known process operations have not been described in detail in order not to unnecessarily obscure the present invention. Furthermore, techniques and mechanisms of the present invention will sometimes be described in singular form for clarity. However, it should be noted that some embodiments can include multiple iterations of a technique or multiple instantiations of a mechanism unless noted otherwise. For example, a processor is used in a variety of contexts. However, it will be appreciated that multiple processors can also be used while remaining within the scope of the present invention.

A variety of systems can be implemented on a programmable device having both logic elements and a processor core. In one example, a computer with a processor core, memory, local area network (LAN) interface, and a universal asynchronous receiver transmitter (UART) can be collected on a single programmable device such as an FPGA. The programmable device can also include customized logic for performing specialized functions for optimizing a particular application. In one example, logic elements are allocated for implementing a digital signal processing (DSP) core for performing Fast Fourier Transform (FFT) operations. In another example, logic elements are allocated for optimizing video rendering functions.

A programmable chip size is typically placed onto a board such as a printed circuit board to allow the chip to interact with external components. Although a system on a programmable chip can include all the components needed to build a full system, it is often beneficial to use a system on a programmable chip with other readily available devices such as memory components or application specific standard product (ASSP) chips. An ASSP is typically an application specific integrated circuit (ASIC) designed to meet a specific application, but is available in mass market quantities. Some of the chips used in PCs, modems, network controllers, remote controllers, etc. can be classified as ASSPs. It may be less expensive to include an ASSP or a large block of memory on an off chip component than it is to include the logic or memory on the programmable device. Programmable devices along with other components such as memory or ASSP chips can be included on a printed circuit board or card and incorporated into a rack to allow for system operation.

However, techniques and mechanisms for integrating a programmable device such as a system on a programmable chip onto a printed circuit board are limited. Designers typically use schematic tools to generate computer readable netlists after determining the configuration of a programmable chip package. A designer keeps track of particular ground and voltage pins, along with particular address pins. In many instances, schematic tools are manually operated to keep track of every device to be implemented on a printed circuit board. A computer readable netlist is then provided to a variety of PCB layout tools. The PCB layout tools can then be used to configure the electrical traces on a PCB. A variety of PCB layout tools are available.

Some available PCB layout tools include Allegro, available from Cadence Design Systems of San Jose, Calif.; The Expedition Series available from Mentor Graphics Corporation of Wilsonville, Oregon; and Cadstar available from Zuken Limited of Yokohama, Japan.

However, using schematic tools to generate computer readable netlists for PCB layout tools is a tedious and error prone process. Tools are needed to keep track of every pin from every chip on the board. As pin counts increase, design becomes exponentially more difficult. Weeks of time and thousands of dollars are required to respin the board if an error does occur. Consequently, the techniques of the present invention provide mechanisms to allow a computer readable netlist to be automatically generated upon implementing a programmable device using a system generator. A user selects components for a programmable device and a system generation tool implements the programmable device with the selected configured components and also provides a computer readable netlist to a conventional PCB layout tool. Any mechanism specifying connections for nodes or signals in a schematic is referred to herein as a netlist. Automatically generating a netlist reduces board design time substantially. The best design practices can be incorporated into the netlist generator.

Designers have a variety of options available for implementing a system on a programmable device. The typical instances, the designer provides both a hardware and a software design. A hardware design can be used implement a particular hardware accelerator on the programmable device. Software can run on a general-purpose processor included on the device. Any logic or mechanisms supporting a general-purpose instruction set such as a reduced instruction set computing (RISC) instruction set, a complex instruction set computing (CISC), or a very long instruction word (VLIW), instruction set is referred to herein as a general-purpose processor or a central processing unit. Conventional processors include the Xeon line of processosr available from Intel Corporation of Santa Clara, Calif. and the Opteron line of processors available from AMD of Sunnyvale, Calif. Conventional processing cores available for implementation on a system on a chip (SOC) or a system on a programmable chip (SOPC) include the ARM line of processor cores available from ARM Ltd. of Cambridge England.

FIG. 1 is a diagrammatic representation showing one example of a system on a programmable chip that can be implemented on a printed circuit board (PCT). The programmable chip system includes a processor core, a hardware accelerator, peripheral devices, and peripheral interfaces. Peripheral devices and peripheral interfaces are herein referred to as components. The system on a programmable chip includes processor core 101 and a hardware accelerator 103 as well as peripheral components UART 111, PIO 113, timer 115, and data memory 117. In some examples, the hardware accelerator 103 is a Digital Signal Processing (DSP) core, a cryptography accelerator, or a video processor. It should be noted that the system can include both on-chip memory 117 and off-chip memory. In one example, the data memory 117 can support variable latency or fixed latency access. The components are interconnected using an interconnection fabric 107. Any mechanism or logic for connecting components in a system is referred to herein as an interconnection fabric. In one example, the interconnection fabric is a bus. In another example, the interconnection fabric is a secondary side arbitration fabric.

The programmable chip uses different types of resources that can be interchangeably used in different allocations to implement the system on a programmable chip. In one example, the programmable chip uses logic elements for implementing each of the various components on the programmable chip.

Logic elements typically can be implemented using components such as antifuses, static RAM, and EPROMS. Any mechanism on a programmable chip that performs an operation on a given number of input lines to provide one or more outputs based on information programmed is herein referred to as a logic element. Some logic elements are implemented as combinations of look up tables and switches for performing Boolean operations on input lines. In one example, a logic element includes a 16-bit SRAM lookup table (LUT)

that can implement an arbitrary 4-input logic function, circuitry that forms a fast carry chain and a fast cascade chain, a register and preset/reset logic for the register.

The techniques and mechanisms of the present invention allow the implementation of a system on a programmable chip from a high-level language program.

Figure 2:
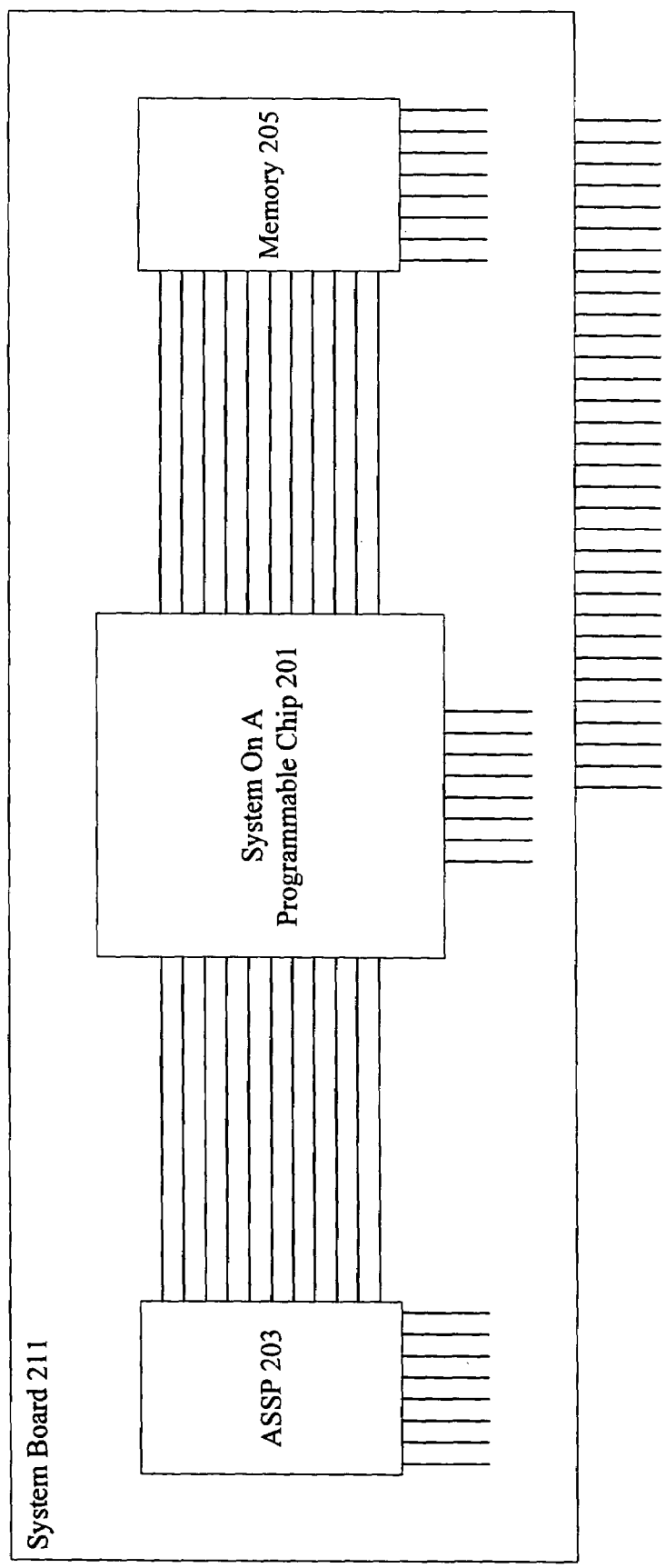
FIG. 2 is a diagrammatic representation depicting a programmable device on a printed circuit board.

FIG. 2 is a diagrammatic representation showing a system on a programmable chip implemented on a board such as a printed circuit board. According to various embodiments, a board 211 includes a system on a programmable chip 201, a memory 205, and ASSP 203. The system on a programmable chip 201, the memory 205, and ASSP 203 are interconnected using schematic traces. In one example, the schematic traces are manually implemented upon identifying the trace layout city for the various components. In another example, designers use tools to aid in implementing schematic traces. In typical instances, a designer identifies the pin layout of a system on a programmable chip and uses a schematic tool to generate a computer readable netlist.

A computer readable netlist associated with each component is provided to a printed circuit board layout tool. The PCB layout is typically capable of automatically routing connections for the various devices after the netlists are provided. However, manually generating the computer readable netlists themselves can be tedious. Designers typically manually generate computer readable netlists for programmable chips. Designers also typically manually generate these netlists for the various other components including memory 205 and ASSP 203. However, because a system on a programmable chip 201 is automatically generated using a system generation tool, techniques of the present invention contemplate also automatically generating a computer readable netlist. It should be noted that although the term netlist is used to describe various pins layouts, the term netlist encompasses alternative formats as well.

The techniques and mechanisms of the present invention provide a system generator that has all of the information needed to generate a computer readable netlist. Other components such as memory 205 and ASSP 203 do not have this feature. When a programmable chip system is implemented, a system generator receives information about various components and uses the information to generate a netlist for a PCB layout tool. Although the techniques of the present invention can be implemented on a variety of programmable device architectures, a few architectures will be shown for context.

Figure 3:
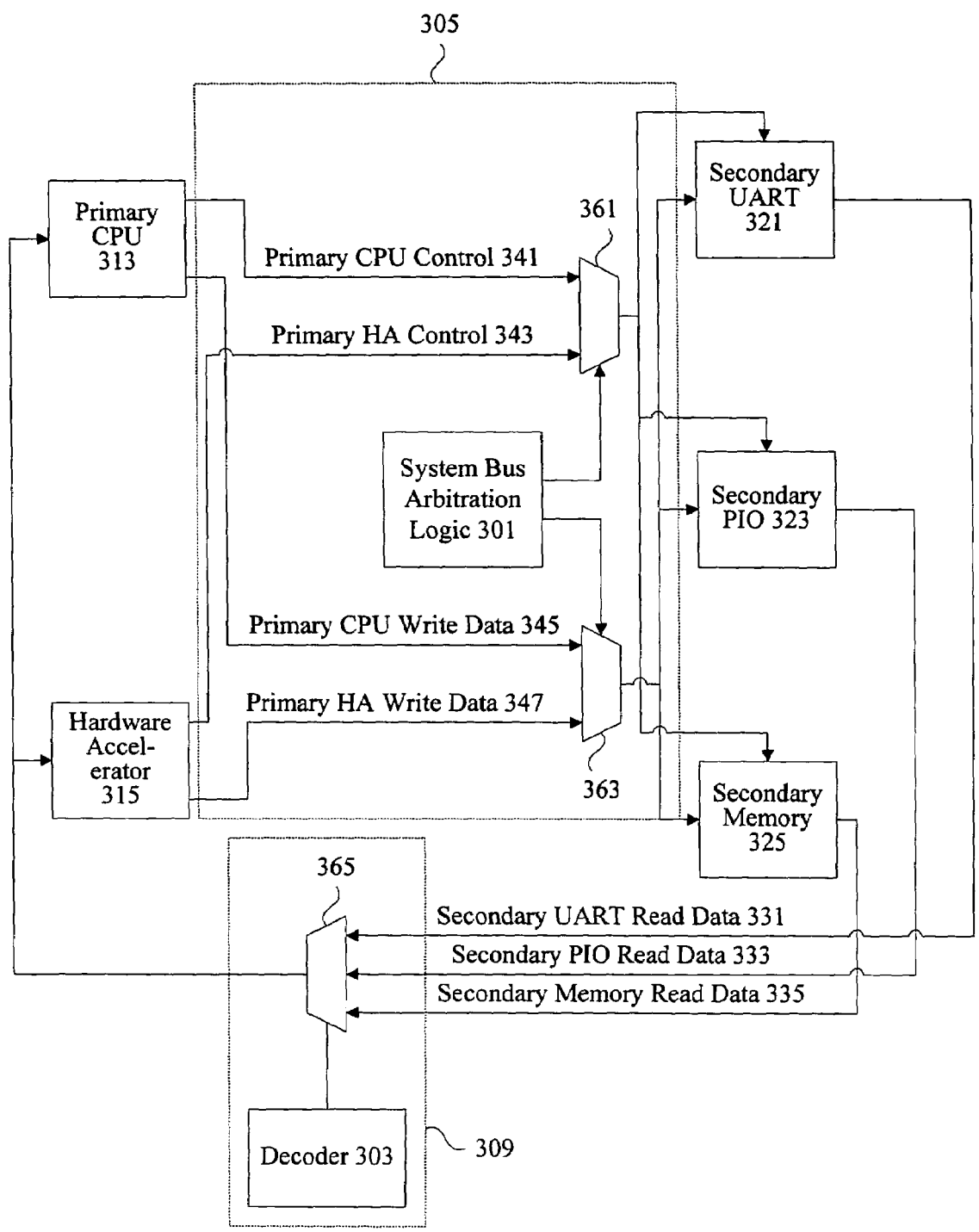
FIG. 3 is a diagrammatic representation showing a conventional bus architecture.

FIG. 3 is a diagrammatic representation depicting a hardware accelerator coupled to a microprocessor in a system using a conventional bus architecture that can be implemented on a programmable chip. Although the techniques of the present invention provide significant performance benefits on a system having a secondary component side arbitration, the techniques can also be used to implement other systems such as conventional system bus implementations. A high-level language program can be used to generate a system having a conventional system bus.

A conventional bus architecture includes a system bus arbitrator 305. A system bus arbitrator 305 includes arbitrator switching circuitry 361 and 363 as well as system bus arbitration logic 301. Logic and mechanisms for selecting an input based on a control signal are referred to herein as arbitrator switching circuitry. It should be noted that although switching circuitry generally can be implemented using multiplexers, a variety of mechanisms including switches and transistors can be used.

Any component or device that is operable to initiate read and write operations by providing control information is referred to herein as a primary component. Primary components are sometimes referred to as master components. Control information can include a particular address associated with a secondary component. Any component or device that responds to read or write operations with information sent back to the primary component regarding the read or write operation is referred to herein as a secondary component. Secondary components are sometimes referred to as slave components. Some examples of primary components are processors, microcontrollers, and Ethernet devices. Some examples of secondary components are Universal Asynchronous Receiver Transmitters (UARTs), Parallel Input Output (PIO), program memory, and data memory. It should be noted that some components such as an Ethernet component can be both a primary component and a secondary component, as an Ethernet component has the capability of reading and writing to the secondary program memory while also responding to instructions from a primary system CPU.

Logic and mechanisms for providing the control signal based on criteria such as fairness or priority are referred to herein as arbitration logic. The inputs of the arbitrator switching circuitry 361 and 363 are connected to primary CPU 313 and hardware accelerator 315. The outputs of the arbitrator switching circuitry 361 and 363 are connected to secondary UART 321, secondary PIO 323, and secondary peripheral interface 325. The outputs of the secondary components transmit information such as read data back to the primary components through a decoder 309. Mechanisms for selecting secondary components and translating control information such as addresses is referred to herein as a decoder. In conventional computer systems, there is a single decoder for each bus. A decoder 309 includes decoder logic 303 and decoder switching circuitry 365 for selecting the particular secondary component data transfer. A decoder can also be referred to as a primary side arbitrator including primary side arbitration logic and primary side switching circuitry.

A system bus typically has a set width (e.g. 64 bits, 128 bits) and allows only one primary component to actively use the bus at any one time. In conventional systems, only one primary component can access any one of the given secondary components and any given time. Multiple primary components accessing secondary components in a manner that would cause data bit collisions if performed on the same data lines is referred to herein as accessing secondary components at the same time.

In one example, a hardware accelerator is accessing a secondary PIO. While the hardware accelerator is accessing the secondary PIO, a processor can not access an SDRAM through a peripheral interface even if both the primary streaming output device and the peripheral interface are available.

The system bus arbitration logic 301 determines which primary component has access to the system bus at any time. The system bus arbitrator 301 can determine which primary component can access a secondary component based on criteria such as fairness or priority. Any component or device that is configured to ensure that only one primary component can access any one of the secondary components at any given time is referred to herein as a system bus arbitrator. Various schemes such as weighted fairness can be implemented to improve the efficiency of secondary component access, but such schemes can increase system complexity and latency. In conventional implementations, a computer system includes a single system bus arbitrator for each bus in the computer system.

According to various embodiments of the present invention, it is recognized that a bus is no longer required in certain applications such as system on a chip, system on a programmable chip, and other computer system implementations. A device such as a programmable logic device (PLD) or a field programmable gate array (FPGA) using a hardware descriptor language (HDL) is herein referred to as a programmable chip or a programmable device. Instead of implementing complicated bus sharing schemes using mechanisms such as splitting, the bus itself can be eliminated to improve system performance.

According to specific embodiments, it is recognized that primary components and secondary components need not be routed through a construct such as a bus. By not routing signals through a bus, a streaming output device can be implemented in a much more efficient manner. The conventional data and address lines that make up the bus are no longer the resource in contention. Instead, secondary components are resources in contention, as the number of physical lines connected to each secondary component in a system can be fixed. Furthermore, by not using a bus, interconnection flexibility is enhanced. For example, a hardware accelerator can be allocated a variety of ports for directly accessing a memory and the only resource in contention would by the memory.

Consequently, a system bus arbitrator associated with all the secondary components in a computer system is no longer needed. Instead, secondary components themselves that may be accessed by more than one primary component are assigned individual secondary side arbitrators. An arbitrator that corresponds to a specific secondary component accessible by more than one primary component is referred to herein as a secondary side arbitrator. In one embodiment, there is a secondary side arbitrator for each secondary component in a computer system. In other embodiments, there is a secondary side arbitrator for selected secondary components in a system. The techniques of the present invention recognize that hardware accelerator support for high-level language programs can be more efficiently and effectively provided in a system by using secondary side arbitration.

Figure 4:
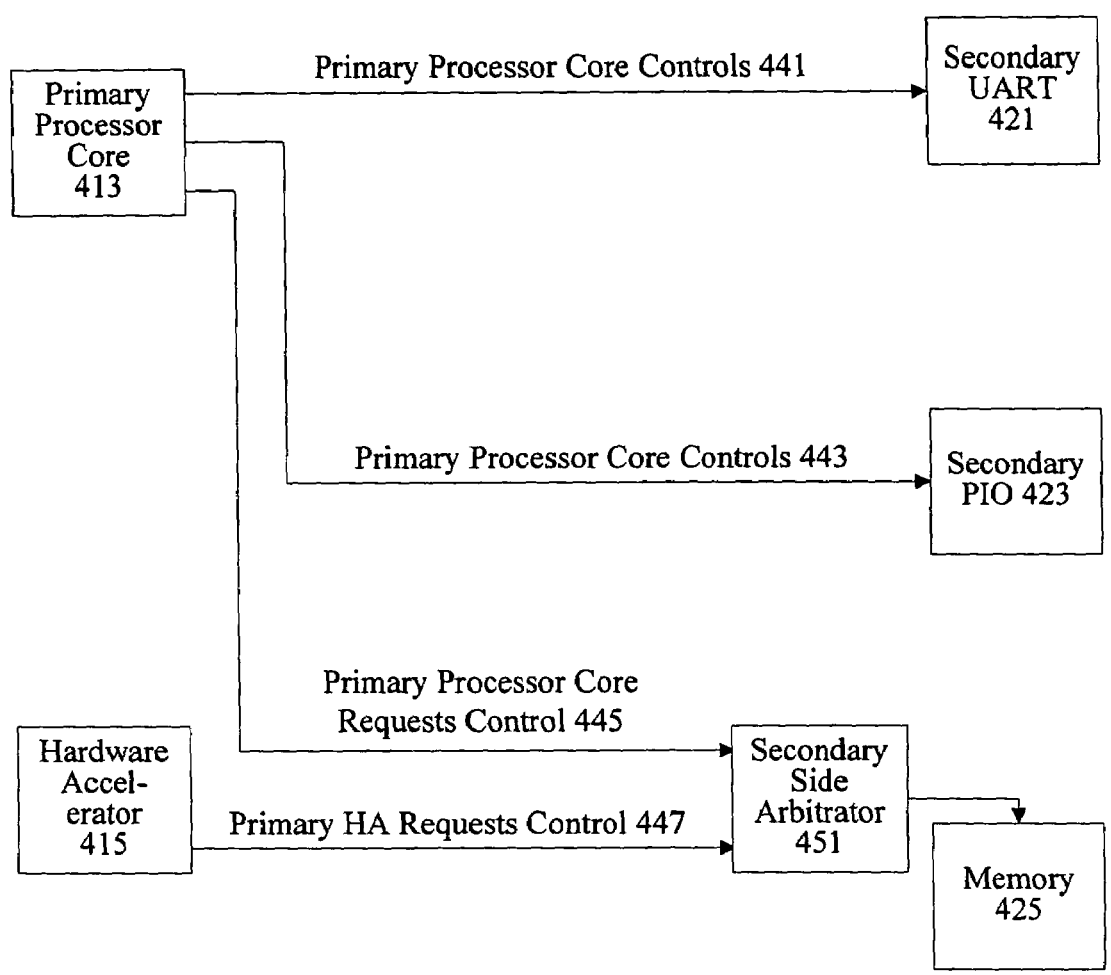
FIG. 4 is a diagrammatic representation showing an interconnection fabric.

FIG. 4 is a diagrammatic representation showing one example of a system using secondary side arbitration, sometimes referred to as slave side arbitration, simultaneous multiple primary components, or simultaneous multiple masters. A system using individual arbitrators that correspond to individual secondary components accessible by more than one primary component is referred to herein as a secondary side arbitration system. The secondary side arbitration system no longer requires a bus or a system bus arbitrator that prevents a second primary component from accessing a second secondary component when a first primary component is accessing a first secondary component. According to various embodiments a secondary component such as peripheral interface 425 is associated with a secondary side arbitrator 451. However, secondary components UART 421 and PIO 423 are not associated with any arbitrator. In one example, secondary component UART 421 and secondary PIO 423 can only be accessed by primary CPU 413 and not by primary Ethernet device 415. A secondary memory component 425, however, can be accessed by both primary CPU 413 and primary Ethernet device 415.

According to various embodiments, a secondary side arbitrator 451 allows a first secondary component in a system to be accessed by a first primary component at the same time a second secondary component in the system is accessed by a second primary component. For example, peripheral interface 425 can be accessed by primary Ethernet 415 through secondary side arbitrator 451 at the same time, secondary UART 421 is accessed by primary CPU 413.

By allowing a CPU to access a secondary component at the same time another primary component such as a streaming output device or an Ethernet component is accessing memory, bus bottlenecks can be reduced. By using the simultaneous multiple primary component architecture, more direct connections between components can also be supported.

Figure 5:
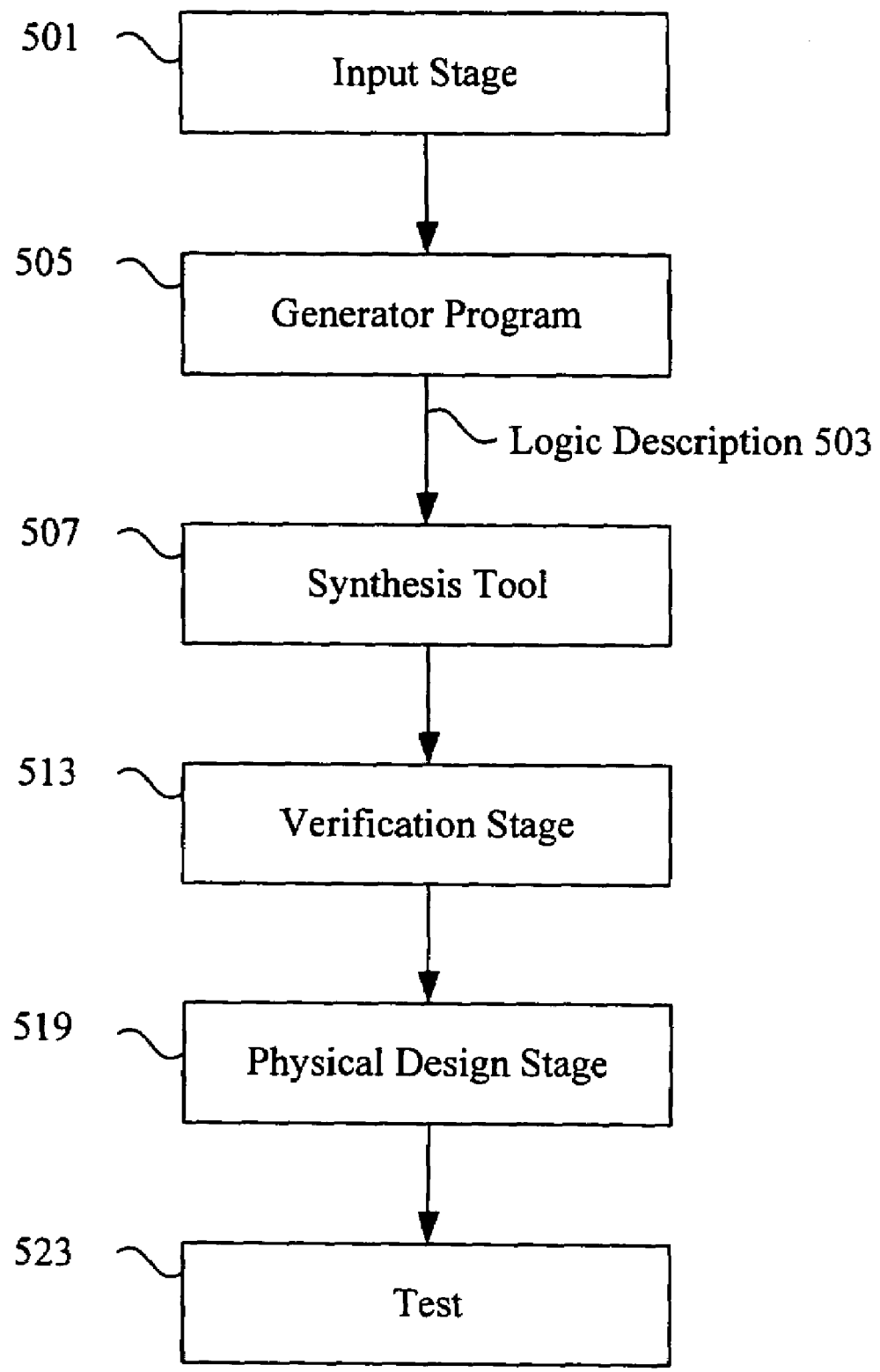
FIG. 5 is a diagrammatic representation showing a technique for implementing the programmable chip.

FIG. 5 is a flow process diagram showing one example of a technique for implementing a programmable chip for layout on a printed circuit board. An input stage 501 receives selection information typically from a user for logic such as a processor core as well as other components to be implemented on an electronic device. In one example, the input received is in the form of a high-level language program. A generator program 505 creates a logic description and provides the logic description along with other customized logic to any of a variety of synthesis tools, place and route programs, and logic configuration tools to allow a logic description to be implemented on an electronic device.

In one example, an input stage 501 often allows selection and parameterization of components to be used on an electronic device. The input stage 501 also allows configuration of variable or fixed latency support. In some examples, components provided to an input stage include intellectual property functions, megafunctions, and intellectual property cores. The input stage 501 may be a graphical user interface using wizards for allowing efficient or convenient entry of information. The input stage may also be a text interface or a program reading a data file such as a spreadsheet, database table, or schematic to acquire selection information. The input stage 501 produces an output containing information about the various modules selected.

In typical implementations, the generator program 505 can identify the selections and generate a logic description with information for implementing the various modules. The generator program 505 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 505 identifies pointers and provides ports for each pointer. One tool with generator program capabilities is System on a Programmable Chip (SOPC) Builder available from Altera Corporation of San Jose, Calif. The generator program 505 also provides information to a synthesis tool 507 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oregon and Synplify available from Synplicity Corporation of Sunnyvale, Calif. The HDL files may contain technology specific code readable only by a synthesis tool. The HDL files at this point may also be passed to a simulation tool 509.

As will be appreciated by one of skill in the art, the input stage 501, generator program 505, and synthesis tool 507 can be separate programs. The interface between the separate programs can be a database file, a log, or simply messages transmitted between the programs. For example, instead of writing a file to storage, the input stage 501 can send messages directly to the generator program 505 to allow the generator program to create a logic description. Similarly, the generator program can provide information directly to the synthesis tool instead of writing HDL files. Similarly, input stage 501, generator program 505, and synthesis tool 507 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 507.

A synthesis tool 507 can take HDL files and output EDF files. Tools for synthesis allow the implementation of the logic design on an electronic device. Some of the available synthesis tools are Leonardo Spectrum, available from Mentor Graphics Corporation of Wilsonville, Oregon and Synplify available from Synplicity Corporation of Sunnyvale, Calif. Various synthesized netlist formats will be appreciated by one of skill in the art.

A verification stage 513 typically follows the synthesis stage 507. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 513, the synthesized netlist file can be provided to physical design tools 519 including place and route and configuration tools. A place and route tool typically locates logic cells on specific logic elements of a target hardware device and connects wires between the inputs and outputs of the various logic elements in accordance with logic required to implement an electronic design. The device can also be physically tested at 523.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 501, the generator program 505, the synthesis tool 507, the verification tools 513, and physical design tools 519 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 6:
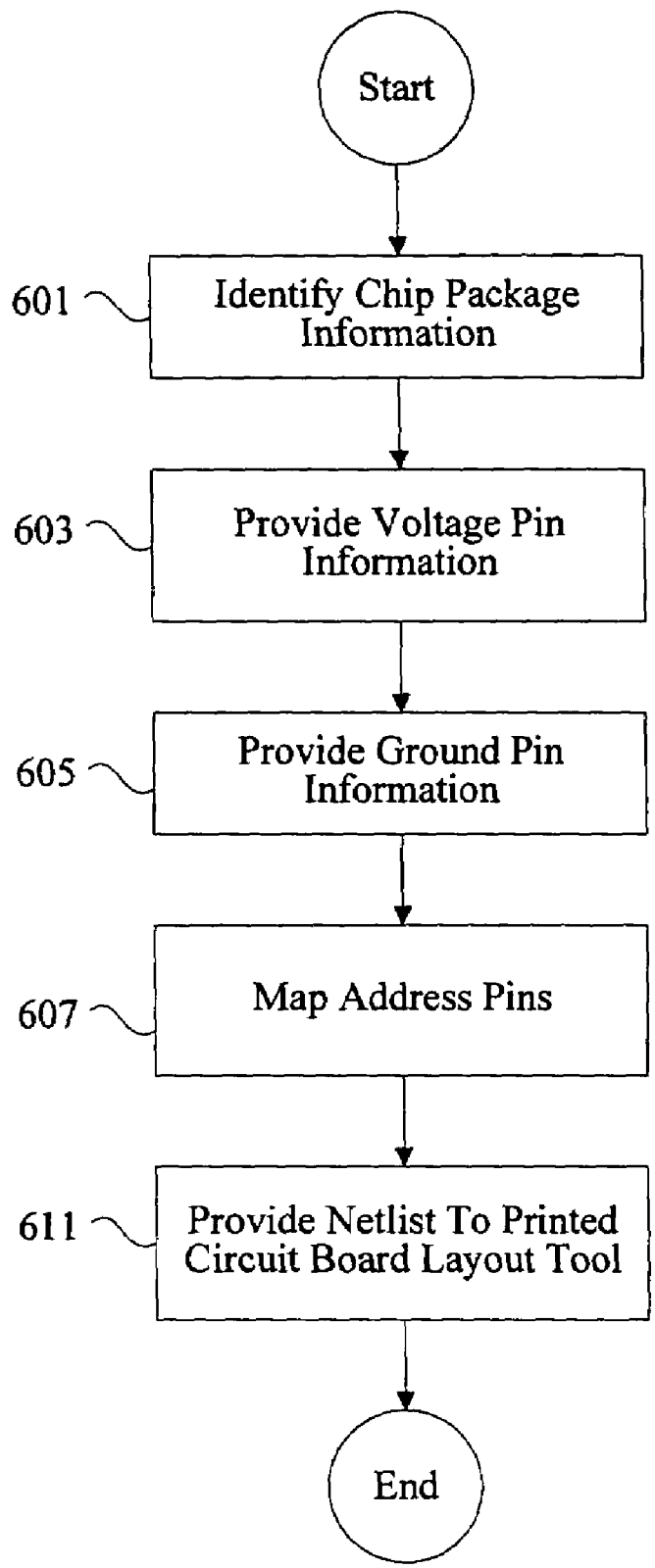
FIG. 6 is a process flow diagram showing a technique generating a computer readable netlist.

FIG. 6 is a flow process diagram showing one technique for implementing a programmable chip on a system board. At 601, chip package information is identified. In one example, chip package information includes the number and type of pins associated with the system on a programmable chip. According to various embodiments, the following chip package information can be provided:

type="TQFP";
Total_Pins="48";

At 603, voltage information is provided. In one embodiment, pins associated with particular voltages are listed. Instructions can also be included to bypass a capacitor. In one example, voltage pins are listed in the following manner:

DVDD="1,2,3,30,31,32,46,47,48";

At 605, ground information is provided. In one embodiment, ground pins are provided in a listing along with instructions to bypass capacitors. The voltage supply information and also be provided with the voltage pin and ground information. In one example, ground pins are listed in the following manner.

DGND="4,5,6,9,10,20,21,22,";

At 607, address pins are mapped. According to various embodiments, various pins associated with the system on a programmable chip are configured with various addresses for reading your writing data from a system on a programmable chip. In one example, address pins are mapped in the following manner.

address_0=23;
address_1=24;
address_2=25;
address_3=26;
address_4=28;
select=13;

At 611, the netlist is provided to a printed circuit board layout tool. In addition to correctly wiring a system on a programmable chip to external device pins, a generator can add bypass capacitors and known good power supply logic to the netlist.

Some parts wire the programmable chip system to other components. An example of an external component is a UART. Due to voltage considerations, the pins wire to a level shifter and then to a separate DB9 connector. Mentioning additional components in a PTF file would allow for this.

Figure 7:
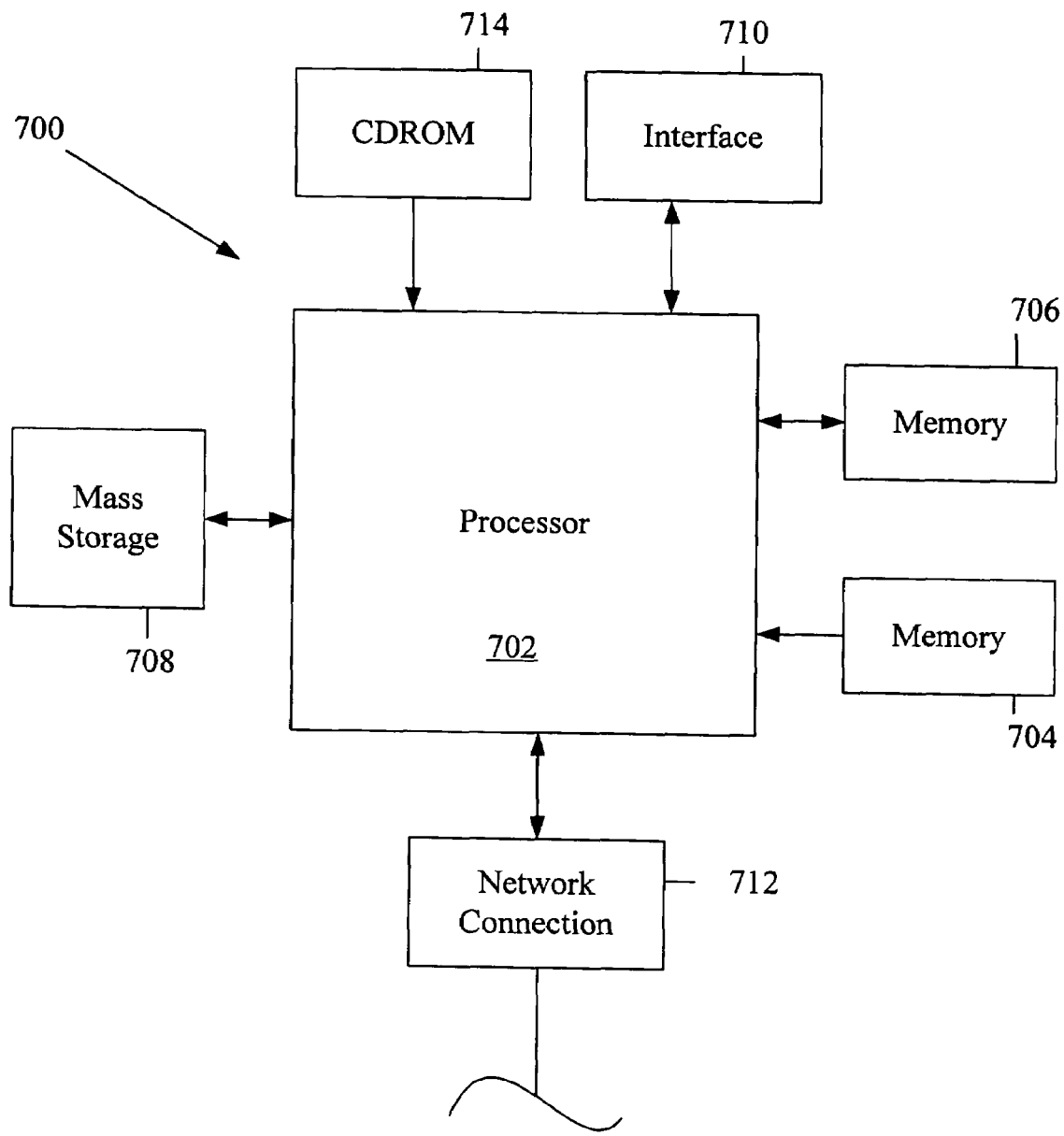
FIG. 7 is a diagrammatic representation depicting a computer system.

FIG. 7 illustrates a typical computer system that can be used to implement a programmable chip on a system board. The computer system 700 includes any number of processors 702 (also referred to as central processing units, or CPUs) that are coupled to devices including memory 706 (typically a random access memory, or "RAM"), memory 704 (typically a read only memory, or "ROM"). The processors 702 can be configured to generate a test sequences for any designated processor. As is well known in the art, memory 704 acts to transfer data and instructions unidirectionally to the CPU and memory 706 is used typically to transfer data and instructions in a bi-directional manner.

Both of these memory devices may include any suitable type of the computer-readable media described above. A mass storage device 708 is also coupled bi-directionally to CPU 702 and provides additional data storage capacity and may include any of the computer-readable media described above. The mass storage device 708 may be used to store programs, data and the like and is typically a secondary storage medium such as a hard disk that is slower than memory. The mass storage device 708 can be used to hold a library or database of prepackaged logic or intellectual property functions, as well as information on generating particular configurations. It will be appreciated that the information retained within the mass storage device 708, may, in appropriate cases, be incorporated in standard fashion as part of memory 706 as virtual memory. A specific mass storage device such as a CD-ROM 714 may also pass data uni-directionally to the CPU.

CPU 702 is also coupled to an interface 710 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 702 optionally may be coupled to a computer or telecommunications network using a network connection as shown generally at 712. With such a network connection, it is contemplated that the CPU might receive information from the network, or might output information to the network in the course of performing the above-described method steps. It should be noted that the system 700 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 708 or 714 and executed on CPU 708 in conjunction with primary memory 706.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of primary and secondary components and should not be restricted to the ones mentioned above. It is therefore intended that the invention be interpreted to include all variations and equivalents that fall within the true spirit and scope of the present invention.

What is claimed is:

1. A method for implementing a programmable chip system onto a printed circuit board, the method comprising:

receiving at a generator module customization information associated with a processor core and a plurality of programmable chip components;

configuring, at the generator module, the processor core and the plurality of programmable chip components for implementation on the programmable chip system, including creating a logic description and providing the logic description to a synthesis tool;

automatically determining voltage and ground pins associated with the programmable chip system;

utilizing the generator module to automatically generate a netlist and automatically providing the netlist to a printed circuit board layout tool which uses the netlist to generate a layout coupling the processor core and the plurality of programmable chip components to off-chip components; and utilizing one or more secondary side arbitrators with one or more of the plurality of programmable chip components, thereby enabling direct communication between a secondary component to which a secondary side arbitrator corresponds and a primary programmable chip component; and wherein the processor core transmits request controls to the secondary side arbitrator corresponding to the secondary component.

2. The method of claim 1, wherein the netlist is a printer circuit board netlist.

3. The method of claim 2, wherein capacitors are bypassed for ground pins and voltage pins.

4. The method of claim 1, wherein the plurality of programmable chip components are received from a library.

5. The method of claim 1, wherein customization information includes parameterization information.

6. The method of claim 1, wherein the processor core and the plurality of programmable chip components are connected using a simultaneously multiple primary component fabric.

7. The method of claim 1, wherein the off-chip component is an external memory device.

8. The method of claim 1, wherein the off-chip component is an application specific standard product.

9. The method of claim 8, wherein the printed circuit board layout tool takes the netlist and generates schematic traces.

10. A system for implementing a programmable chip system, the system comprising:

a generator module having an interface operable to receive customization information associated with a processor core and a plurality of programmable chip components;

a processor operable to configure the processor core and the plurality of programmable chip components for implementation on the programmable chip and operable to create a logic description and provide the logic description to a synthesis tool, the processor configured to determine voltage and ground pins associated with the programmable chip system and to automatically generate a netlist and to provide a netlist to printed circuit board layout tool, wherein the printed circuit board layout tool uses the netlist to generate a connection layout coupling the processor core and the plurality of programmable chip components to off-chip components; and one or more secondary side arbitrators to enable direct communication between a secondary component and a primary programmable chip component, wherein the processor transmits request controls to the secondary side arbitrator corresponding to the secondary component.

11. The system of claim 10, wherein the netlist is a printer circuit board netlist.

12. The system of claim 11, wherein capacitors are bypassed for ground pins and voltage pins.

13. The system of claim 10, wherein the plurality of programmable chip components are received from a library.

14. The system of claim 13, wherein customization information includes parameterization information.

15. The system of claim 14, wherein the processor core and the plurality of programmable chip components are connected using a simultaneously multiple primary component fabric.

16. The system of claim 10, wherein the off-chip component is an external memory device.

17. The system of claim 10, wherein the off-chip component is an application specific standard product.

18. The system of claim 17, wherein the printed circuit board layout tool takes the netlist and generates schematic traces.

19. An apparatus for implementing a programmable chip system onto a printed circuit board, the apparatus comprising:

means for receiving at a generator module customization information associated with a processor core and a plurality of programmable chip components;

means for configuring, at the generator module, the processor core and the plurality of programmable chip components for implementation on the programmable chip system, including creating a logic description and providing the logic description to a synthesis tool;

means for automatically determining voltage and ground pins associated with the programmable chip;

means for utilizing the generator module to automatically generate a netlist and automatically providing the netlist to a printed circuit board layout tool which uses the netlist to generate a layout coupling the processor core and the plurality of programmable chip components to off-chip components; and means for utilizing one or more secondary side arbitrators with one or more of the plurality of programmable chip components, thereby enabling direct communication between a secondary component to which a secondary side arbitrator corresponds and a primary programmable chip component; and wherein the processor core transmits request controls to the secondary side arbitrator corresponding to the secondary component.

20. The apparatus of claim 19, wherein the netlist is a printer circuit board netlist.

21. The apparatus of claim 20, wherein capacitors are bypassed for ground pins and voltage pins.

22. The apparatus of claim 19, wherein the plurality of programmable chip components are received from a library.

23. The apparatus of claim 19, wherein customization information includes parameterization information.

24. The apparatus of claim 19, wherein the processor core and the plurality of programmable chip components are connected using a simultaneously multiple primary component fabric.

25. The apparatus of claim 19, wherein the off-chip component is an external memory device.

26. The apparatus of claim 19, wherein the off-chip component is an application specific standard product.

* * * * *